United States Patent
Song et al.

(10) Patent No.: US 12,067,478 B2
(45) Date of Patent: Aug. 20, 2024

(54) PCM-BASED NEURAL NETWORK DEVICE

(71) Applicant: Samsung Electronics Co., Ltd., Suwon-si (KR)

(72) Inventors: Yun Heub Song, Seongnam (KR); Cheng Li, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1161 days.

(21) Appl. No.: 16/757,283

(22) PCT Filed: Oct. 17, 2018

(86) PCT No.: PCT/KR2018/012225
§ 371 (c)(1),
(2) Date: Apr. 17, 2020

(87) PCT Pub. No.: WO2019/078599
PCT Pub. Date: Apr. 25, 2019

(65) Prior Publication Data
US 2020/0302268 A1    Sep. 24, 2020

(30) Foreign Application Priority Data
Oct. 17, 2017 (KR) .................. 10-2017-0134748

(51) Int. Cl.
*G06N 3/049*      (2023.01)
*G06N 3/063*      (2023.01)
(Continued)

(52) U.S. Cl.
CPC ............. *G06N 3/049* (2013.01); *G06N 3/063* (2013.01); *G06N 3/065* (2023.01); *G06N 3/084* (2013.01);
(Continued)

(58) Field of Classification Search
CPC ........ G06N 3/049; G06N 3/065; G06N 3/063; G06N 3/084; G06N 5/046; G11C 11/54; G11C 13/0004
See application file for complete search history.

(56) References Cited

U.S. PATENT DOCUMENTS 4,874,963 A * 10/1989 Alspector .............. G06N 3/065
377/2
5,293,458 A * 3/1994 Chung ................... G06N 3/063
706/31
(Continued)

FOREIGN PATENT DOCUMENTS

KR    10-1998-0081691 A    11/1998
KR       10-0183406 B      12/1998
(Continued)

OTHER PUBLICATIONS

Kim—A_digital_neuromorphic_VLSI_architecture_with_memristor_crossbar_synaptic_array (Year: 2012).*
(Continued)

*Primary Examiner* — Omar F Fernandez Rivas
*Assistant Examiner* — Shamcy Alghazzy
(74) *Attorney, Agent, or Firm* — Harness, Dickey & Pierce, P.L.C.

(57) ABSTRACT

A phase change material (PCM)-based neural network device according to an embodiment comprises: a plurality of neurons disposed for input layers and output layers, respectively; a plurality of PCMs connecting input lines of the input layers and output lines of the output layers; and at least one backward spike generator (BSG) shared by the plurality of neurons, and generating spike on the basis of an output pulse outputted from each of the neurons of the output layers.

12 Claims, 13 Drawing Sheets

(51) Int. Cl.
G06N 3/065 (2023.01)
G06N 3/084 (2023.01)
G06N 5/046 (2023.01)
G11C 11/54 (2006.01)
G11C 13/00 (2006.01)

(52) U.S. Cl.
CPC .............. *G06N 5/046* (2013.01); *G11C 11/54* (2013.01); *G11C 13/0004* (2013.01)

(56) References Cited

U.S. PATENT DOCUMENTS

| | | | | |
|---|---|---|---|---|
| 5,452,402 | A * | 9/1995 | Sakiyama | G06F 18/00 706/31 |
| 2011/0004579 | A1 * | 1/2011 | Snider | G06N 3/049 706/26 |
| 2012/0109864 | A1 | 5/2012 | Modha | |
| 2014/0279778 | A1 * | 9/2014 | Lazar | G06N 3/02 706/22 |
| 2016/0371582 | A1 * | 12/2016 | Eleftheriou | G06N 3/049 |
| 2017/0017879 | A1 * | 1/2017 | Kataeva | G06F 11/0721 |

FOREIGN PATENT DOCUMENTS

| | | |
|---|---|---|
| KR | 10-2010-0129741 A | 12/2010 |
| KR | 10-2017-0080431 A | 7/2017 |

OTHER PUBLICATIONS

Wan—Efficient_Neuron_architecture_for_FPGA_based_spiking_neural_networks (Year: 2016).*
Ambrogio—Unsupervised Learning by Spike Timing Dependent Plasticity in Phase Change Memory PCM Synapses (Year: 2016).*
Cawley—Hardware spiking neural network prototyping (Year: 2011).*
Diehl—Conversion_of_artificial_recurrent_neural_networks_to_spiking_neural_networks_for_low-power_neuromorphic_hardware (Year: 2016).*
International Patent Application No. PCT/KR2018/012225; Int'l Search Report; dated Jan. 24, 2019; 4 pages.

* cited by examiner

FIG. 2
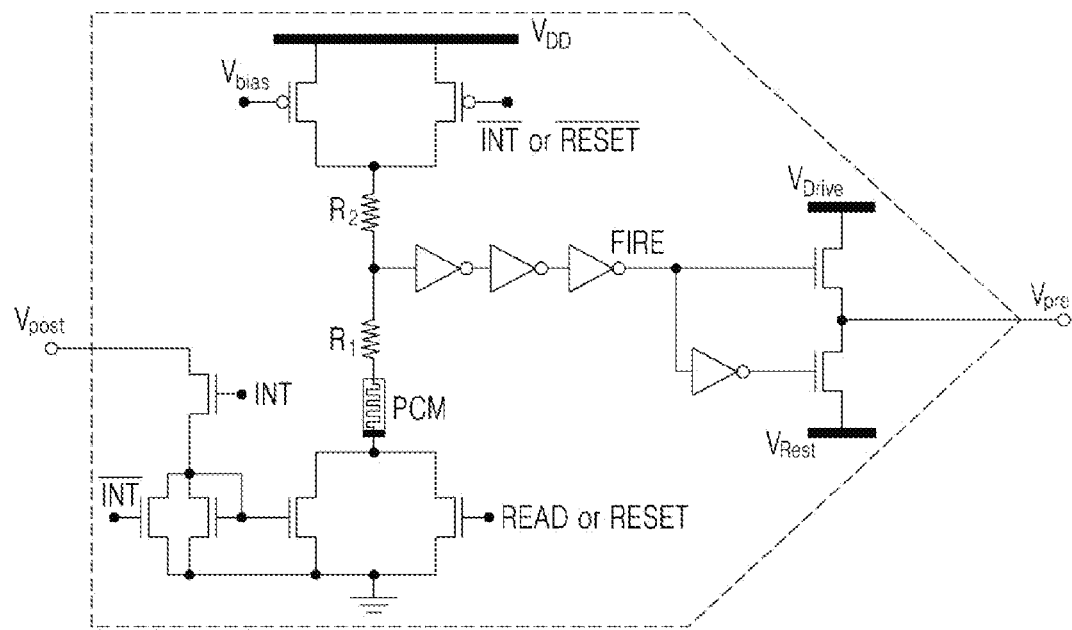
NEURON OF INPUT LAYER (111)
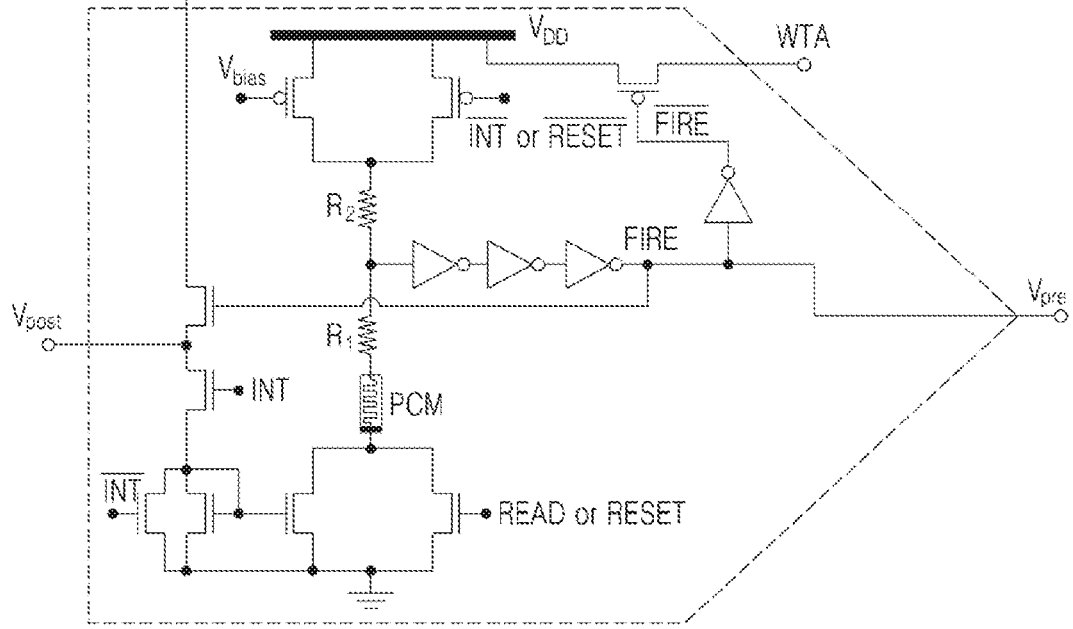
NEURON OF OUTPUT LAYER (121)

FIG. 7
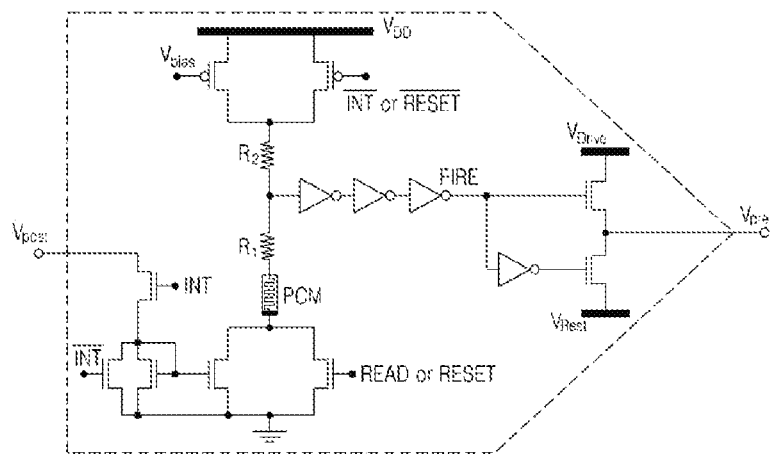
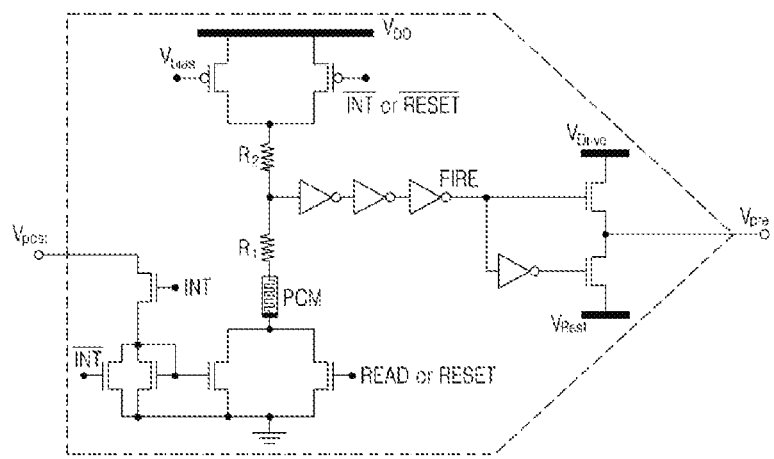
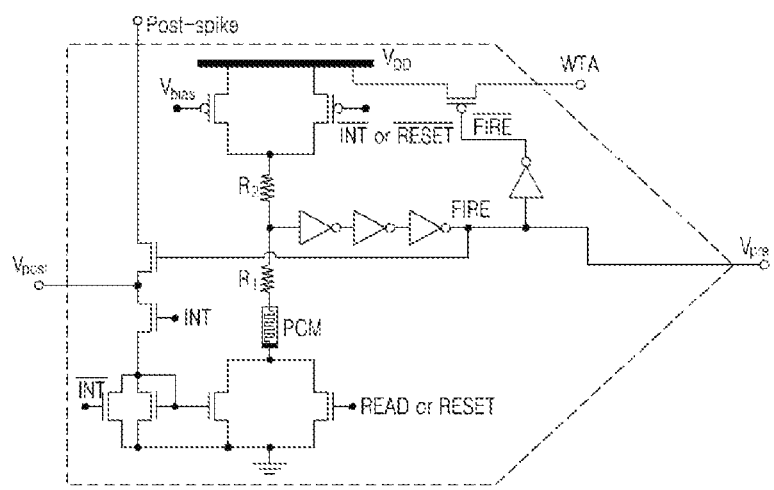

PCM-BASED NEURAL NETWORK DEVICE

TECHNICAL FIELD

The following description relates to a neural network device that models a human nervous system based on a phase change material (PCM), and more particularly, relates to a neural network device reducing the area of the modeled circuit.

BACKGROUND ART

A conventional neural network device is modeled as a circuit including a plurality of input driving amplifiers amplifying and receiving column input signals and a plurality of output driving amplifiers amplifying and outputting row output signals. At this time, the conventional neural network device is formed of the plurality of input driving amplifiers and the plurality of output amplifiers with the same structure (e.g., a structure including a reverse pulse driver, a forward pulse driver, and a Winner-Takes-All (WTA) driver) and is formed such that each of the plurality of input driving amplifiers and the plurality of output amplifiers includes a Spike Generator (SG) that generates spikes. As such, the technology for the conventional neural network device is disclosed in Korean Patent Publication No. 10-0183406.

Accordingly, the conventional neural network device has a disadvantage in that the circuit area of each of the plurality of input driving amplifiers and the plurality of output amplifiers is modeled widely, thereby increasing the overall circuit area. Furthermore, the conventional neural network device has the large energy consumption because each of a plurality of input driving amplifiers and a plurality of output amplifiers includes unnecessary components not related to functions (e.g. pulse inputs or pulse outputs).

Accordingly, the following embodiments are intended to propose a technology for solving the disadvantages of the conventional neural network device.

DETAILED DESCRIPTION OF THE INVENTION

Technical Problem

Embodiments provide a PCM-based neural network device reducing the area and energy consumption of a circuit generated by modeling a human nervous system.

In particular, embodiments provide a neural network device which is configured such that each of a plurality of neurons corresponding to a plurality of input driving amplifiers and output driving amplifiers share at least one Backward Spike Generator (BSG) instead of including an SG, in the conventional existing neural network device.

Furthermore, embodiments provide a neural network device configured such that a plurality of neurons include different components for each layer.

Technical Solution

According to an embodiment, a phase change material (PCM)-based neural network device includes a plurality of neurons disposed on for each of an input layer and an output layer, a plurality of PCMs connecting between input lines of the input layers and output lines of the output layers, and at least one backward spike generator (BSG) shared by the plurality of neurons and generating a spike based on an output pulse output from each of neurons of the output layers.

According to an aspect, each of the plurality of neurons may include different components from one another for the respective layer.

According to another aspect, each of neurons of the input layer may include a PMOS and an NMOS other than a backward pulse driver. Each of neurons of the output layer may include a PMOS and an NMOS other than a forward pulse driver.

According to still another aspect, the PCM-based neural network device may further include at least one control circuit synchronizing timing of a pulse output from each of the plurality of neurons.

According to yet another aspect, the at least one control circuit may be provided for the respective layer.

According to yet another aspect, the at least one control circuit may include a level-1 control circuit synchronizing timing of a pulse output from each of neurons of the input layer, a level-2 control circuit synchronizing timing of an output pulse output from each of neurons of the output layer, and a global control circuit controlling the level-1 control circuit and the level-2 control circuit.

According to an embodiment, a PCM-based neural network device includes a plurality of neurons disposed on for each of an input layer, a hidden layer, and an output layer, a plurality of PCMs connecting between input lines of the input layer and connection lines of the hidden layer and between connection lines of the hidden layer and output lines of the output layer, and at least one BSG shared by the plurality of neurons and generating a spike based on a pulse output from each of neurons of the hidden layer or an output pulse output from each of neurons of the output layers.

According to an aspect, each of the plurality of neurons may include different components from one another for the respective layer.

According to another aspect, each of neurons of the input layer may include a PMOS and an NMOS other than a backward pulse driver. Each of neurons of the hidden layer may include a PMOS and an NMOS other than a Winner-Takes-All (WTA) driver. Each of neurons of the output layer may include a PMOS and an NMOS other than a forward pulse driver.

According to still another aspect, the PCM-based neural network device may further include at least one control circuit synchronizing timing of a pulse output from each of the plurality of neurons.

According to yet another aspect, the at least one control circuit may be provided for the respective layer.

According to yet another aspect, the at least one control circuit may include a level-1 control circuit synchronizing timing of a pulse output from each of neurons of the input layer, a level-2 control circuit synchronizing timing of a pulse output from each of neurons of the hidden layer, a level-3 control circuit synchronizing timing of an output pulse output from each of neurons of the output layer, and a global control circuit controlling the level-1 control circuit, the level-2 control circuit, and the level-3 control circuit.

Advantageous Effects of the Invention

Embodiments may provide a PCM-based neural network device reducing the area and energy consumption of a circuit generated by modeling a human nervous system.

In particular, embodiments may provide a neural network device configured such that each of a plurality of neurons shares at least one BSG instead of including a BSG.

Furthermore, embodiments may provide a neural network device configured such that a plurality of neurons include different components for each layer.

DESCRIPTION OF THE DRAWINGS

FIGS. 1 and 2 are diagrams for describing a 2-layer neural network device according to an embodiment.

FIGS. 6 and 7 are diagrams for describing a three-layer neural network device according to an embodiment.

BEST MODE

Figure 1:
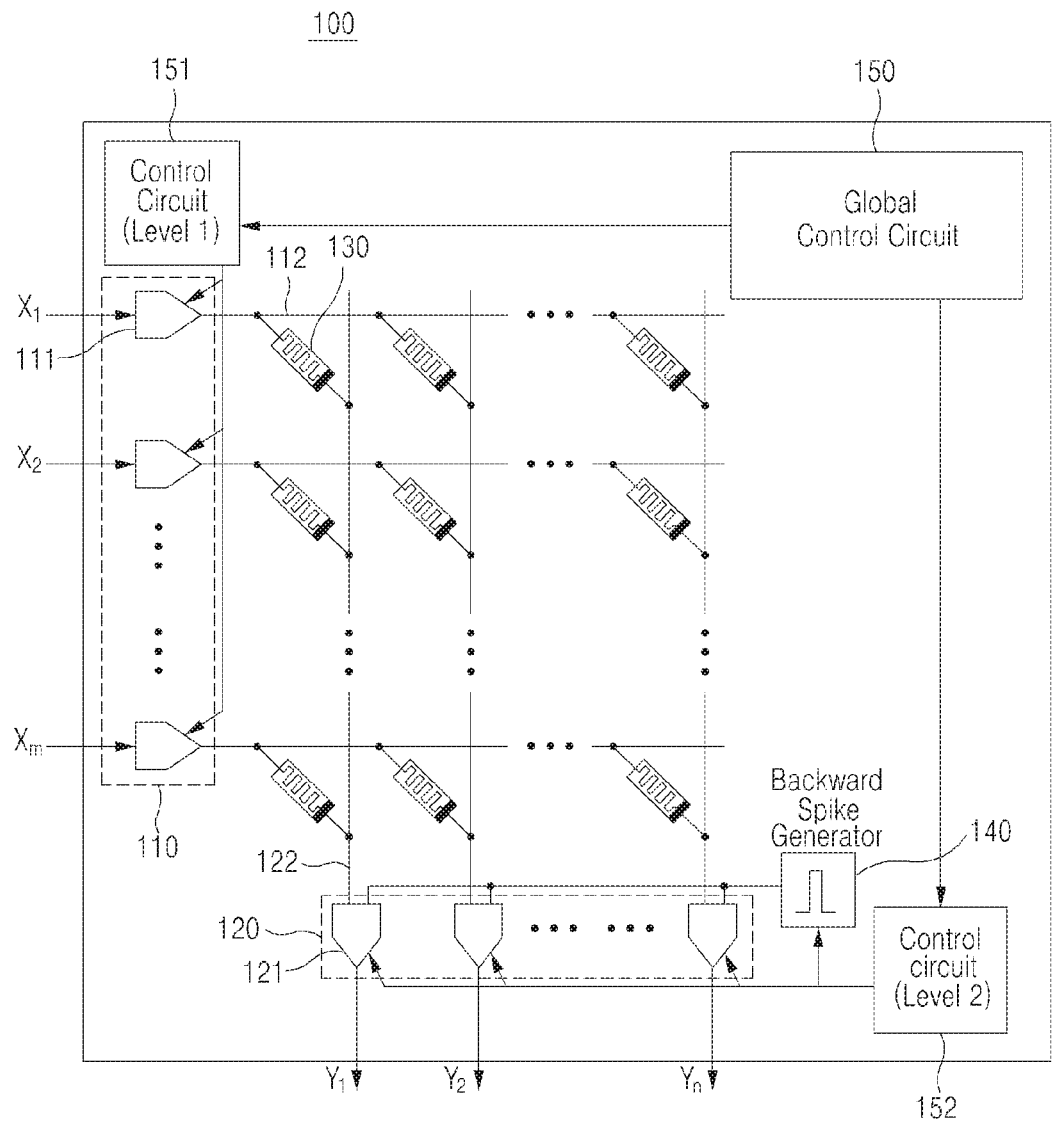

Hereinafter, exemplary embodiments of the inventive concept will be described in detail with reference to the accompanying drawings. However, the inventive concept is neither limited nor restricted by the embodiments.

Further, the same reference numerals in the drawings denote the same members.

Furthermore, the terminologies used herein are used to properly express the embodiments of the inventive concept, and may be changed according to the intentions of a viewer or the manager or the custom in the field to which the inventive concept pertains. Therefore, definition of the terminologies should be made according to the overall disclosure set forth herein.

FIGS. 1 and 2 are diagrams for describing a 2-layer neural network device according to an embodiment.

Referring to FIGS. 1 and 2, a 2-layer neural network device 100 according to an embodiment includes a plurality of neurons 111 and 121 respectively disposed on an input layer 110 and an output layer 120, a plurality of PCMs 130 respectively connecting between input lines 112 of the input layer 110 and output lines 122 of the output layer 120, and a single BSG 140 generating a spike based on an output pulse output from each of the neurons 121 of the output layer 120.

Each of the plurality of neurons 111 and 121 includes different components for each layer. In particular, each of the plurality of neurons 111 and 121 may exclude components for implementing unnecessary functions for each layer to be disposed and may include only the components for implementing necessary functions. That is, each of the plurality of neurons 111 and 121 may include different components depending on the layer to be disposed.

For example, each of the neurons 111 of the input layer 110 among the plurality of neurons 111 and 121 may include only the component for implementing functions necessary to process an input pulse; each of the neurons 121 of the output layer 120 among the plurality of neurons 111 and 121 may include only the component for implementing a function necessary to process an output pulse. For a more specific example, each of the neurons 111 of the input layer 110 among the plurality of neurons 111 and 121 may include PMOS and NMOS excluding a backward pulse driver; each of the neurons 121 of the output layer 120 among the plurality of neurons 111 and 121 may include PMOS and NMOS except for a forward pulse driver.

As such, each of the plurality of neurons 111 and 121 may include the components minimized to implement only the functions according to layers to be disposed, thereby reducing the circuit area and energy consumption as compared to the conventional neuron.

Moreover, while including only the components for implementing functions necessary to process an input pulses, the neurons 111 of the input layer 110 among the plurality of neurons 111 and 121 may include the components for generating regular rectangular pulses instead of generating irregular pulses. As such, the energy calculation of an event occurring in the neurons 111 of the input layer 110 may be simplified.

Each of the plurality of PCMs 130 is crystallized in response to a crystallization current, thereby implementing a multivalued bit. Because each of the plurality of PCMs 130 is the same as a plurality of capacitive devices (PCMs) used in the conventional neural network device, the detailed description thereof will be omitted.

The BSG 140 is shared by the plurality of neurons 111 and 121 upon generating a spike based on the output pulse output from each of the neurons 121 of the output layer 120. In other words, the BSG 140 may be disposed at the output terminal of the neural network device 100 to be connected to each of the neurons 121 of the output layer 120 and may be shared by the neurons 121 of the output layer 120.

As described above, each of the plurality of neurons 111 and 121 may have the reduced circuit area compared to the conventional neuron (each of the conventional neuron includes unnecessary components not related to the disposed layer and includes an SG), thereby minimizing the total circuit area of the neural network device 100.

Besides, as the plurality of neurons 111 and 121 share the single BSG 140, the neural network device 100 may be variously utilized through changing only the BSG 140. A detailed description thereof will be made with reference to FIGS. 3 and 4.

In addition, the neural network device 100 may include at least one control circuit 150, 151, or 152 that synchronizes the timing of each of the pulse output from all of the plurality of neurons 111 and 121. Here, the at least one control circuit 151 and 152 may be provided for each layer.

For example, the level-1 control circuit 151 may be provided to synchronize the timing of a pulse output from each of the neurons 111 of the input layer 110; the level-2 control circuit 152 may be provided to synchronize the timing of the output pulse output from each of the neurons 121 of the output layer 120. In addition, the global control circuit 150 for controlling the level-1 control circuit 151 and the level-2 control circuit 152 may be further provided. Accordingly, the neural network device 100 includes the at least one control circuit 150, 151, or 152, thereby allowing the plurality of neurons 111 and 121 to output pulses at the same timing and to operate synchronously. The detailed description thereof will be described with reference to FIGS. 5A to 5B.

Figure 3:
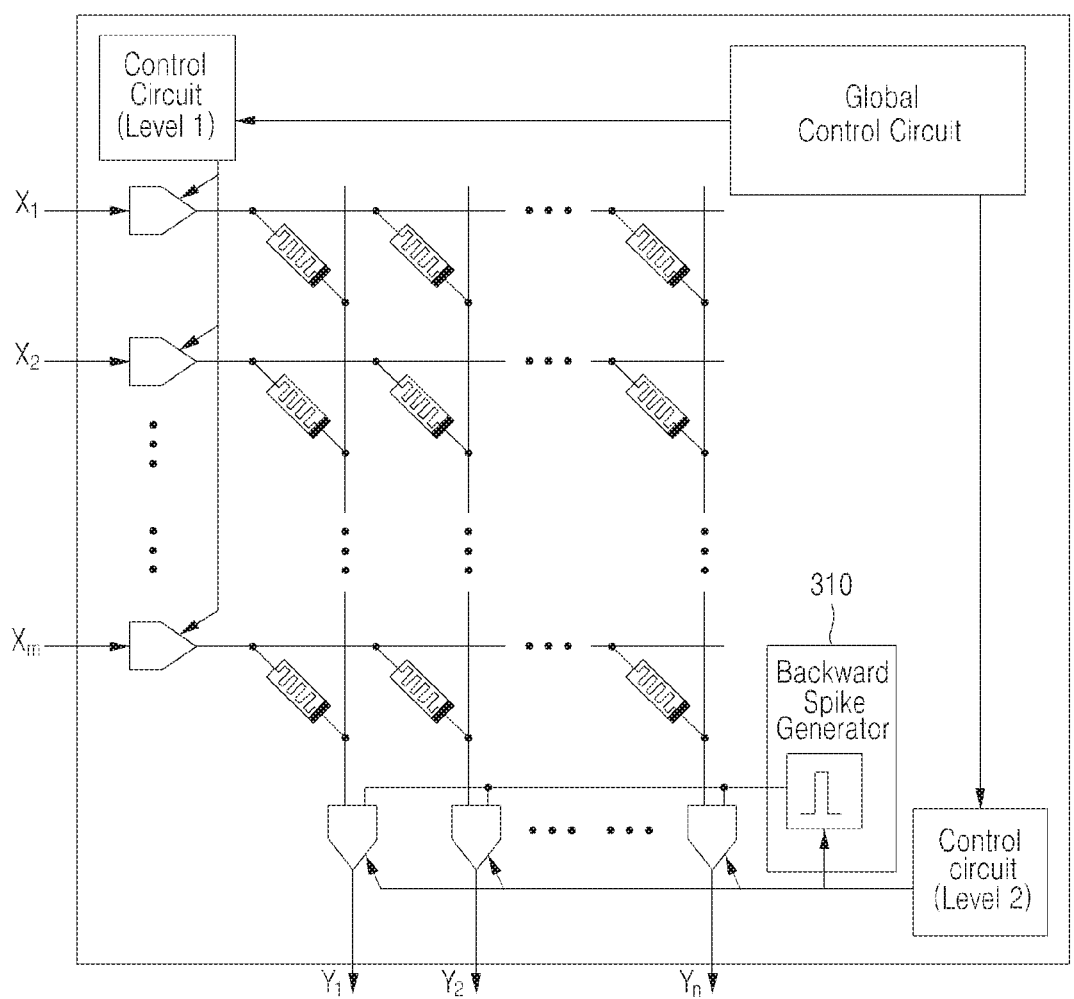
FIGS. 3 and 4 are diagrams for describing usability of a 2-layer neural network device according to an embodiment.
Figure 4:
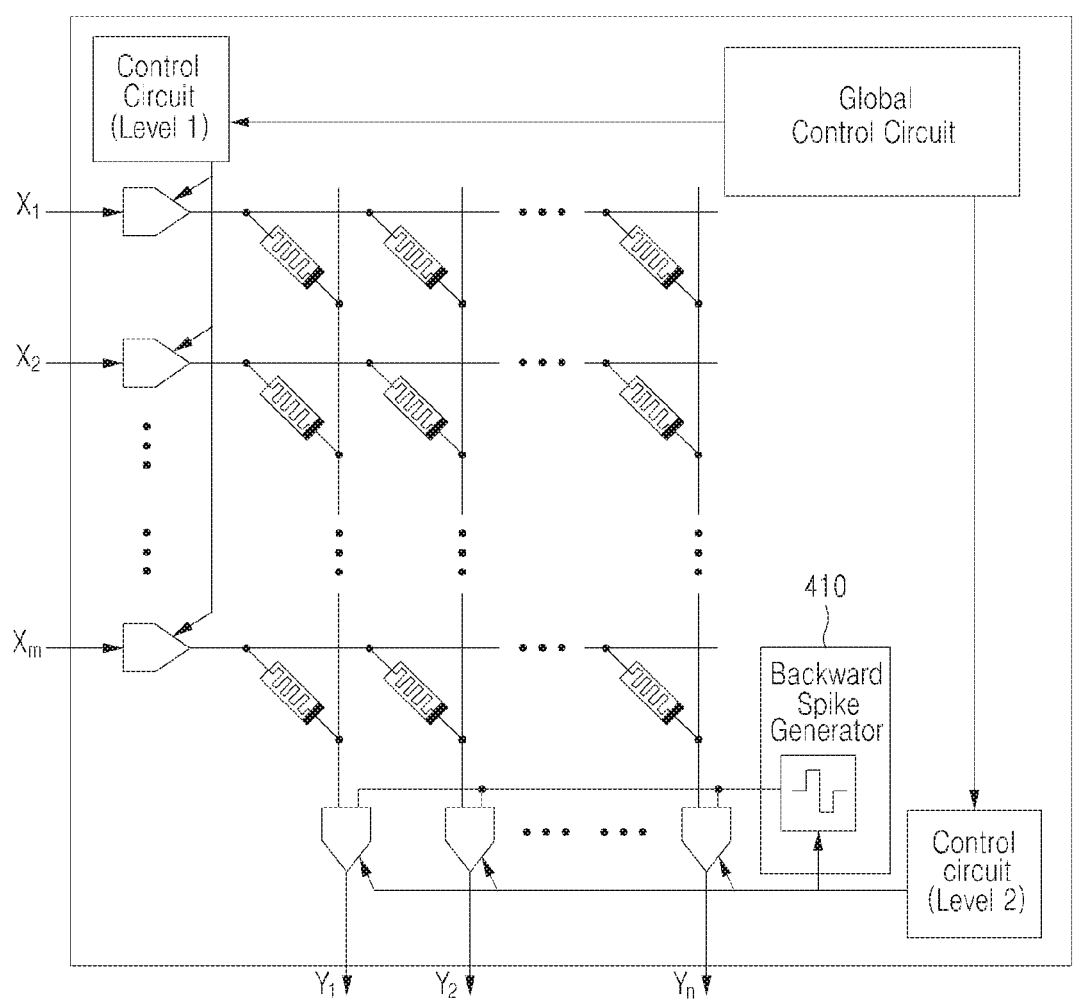

FIGS. 3 and 4 are diagrams for describing usability of a 2-layer neural network device according to an embodiment.

Referring to FIG. 3, a 2-layer neural network device 300 described above with reference to FIGS. 1 and 2 may be utilized as a PCM synapse device, by including at least one BSG 310 implemented to generate a unipolar spike.

Also, referring to FIG. 4, a 2-layer neural network device 400 described above with reference to FIGS. 1 and 2 may be utilized as an ReRAM by including at least one BSG 410 implemented to generate a bipolar spike.

Figure 5A:
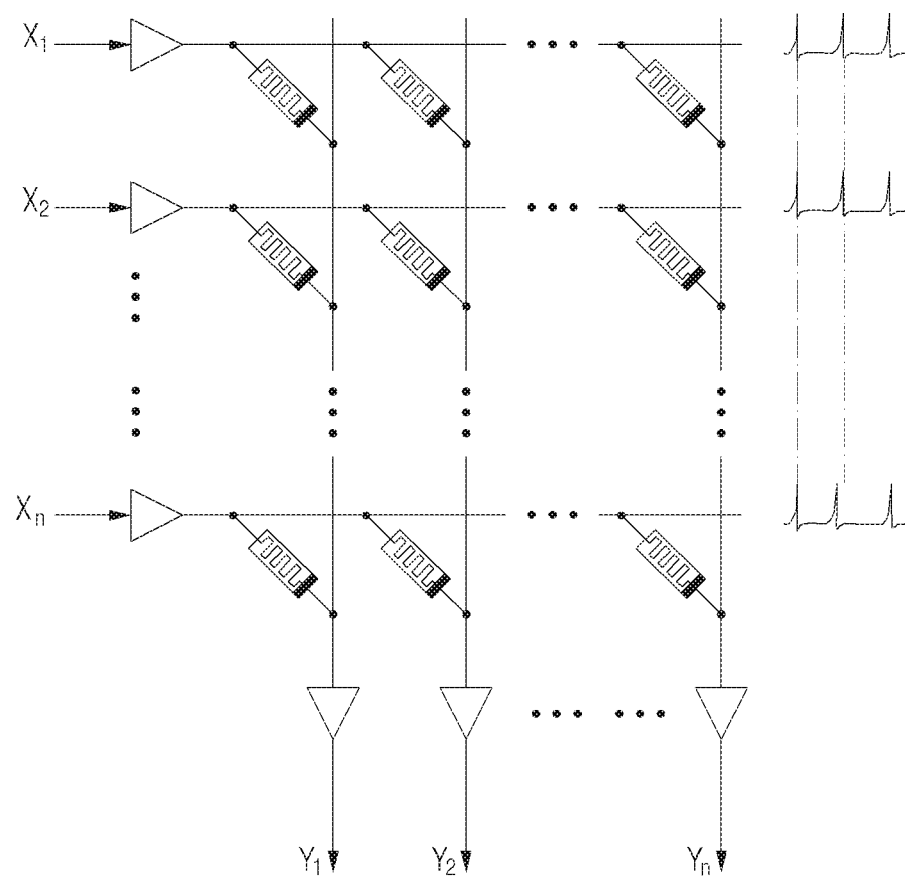
FIGS. 5A and 5B are diagrams for describing that a 2-layer neural network device synchronizes pulse timing, in an embodiment.
Figure 5B:
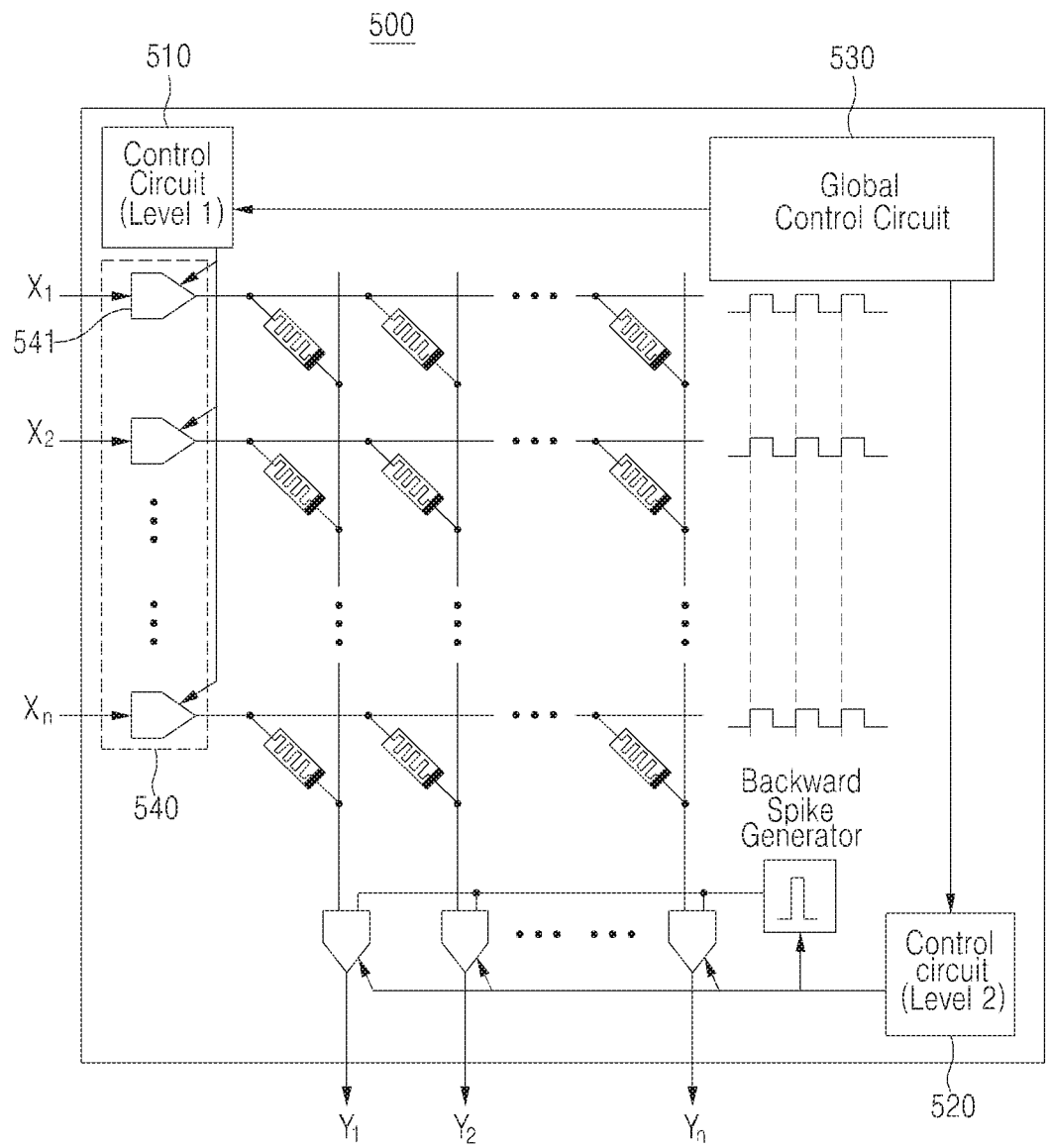

FIGS. 5A and 5B are diagrams for describing that a 2-layer neural network device synchronizes pulse timing, in an embodiment. In particular, FIG. 5A is a diagram illustrating a conventional neural network device. FIG. 5B is a diagram illustrating a neural network device according to an embodiment.

Referring to FIG. 5A, in the conventional neural network device, because each of the input neurons does not operate synchronously, the timing of each of the pulses output by each of the input neurons may also be different from one another.

On the other hand, referring to FIG. 5B, a 2-layer neural network device 500 described with reference to FIGS. 1 and 2 may synchronize the timing of a pulse of each of neurons 541 of an input layer 540 and may synchronize the timing of a pulse of each of the neurons of an output layer, by including at least one control circuit 510, 520, or 530 that synchronizes the timing of each of the pulses output from the plurality of neurons.

For example, the level-1 control circuit 510 may be synchronized such that each neuron 541 of the input layer 540 outputs a pulse having the same timing; the level-2 control circuit 520 may be synchronized such that each of the neurons of the output layer outputs a pulse having the same timing. At this time, the global control circuit 530 may control the level-1 control circuit 510 and the level-2 control circuit 520 such that the neurons 541 of the input layer 540 and the neurons of an output layer are synchronized with each other at the same timing.

Accordingly, the timing of each of the pulses output from the neural network device 500 according to an embodiment is the same as one another, thereby simplifying the energy calculation of an event occurring in the neural network device 500 and significantly reducing the complexity of the synaptic weight update process.

As described above, referring to FIG. 1 to 5B, the 2-layer neural network device has been described, but the neural network device according to an embodiment may be extended to a 3-layer structure. The detailed description thereof will be described below.

Figure 6:
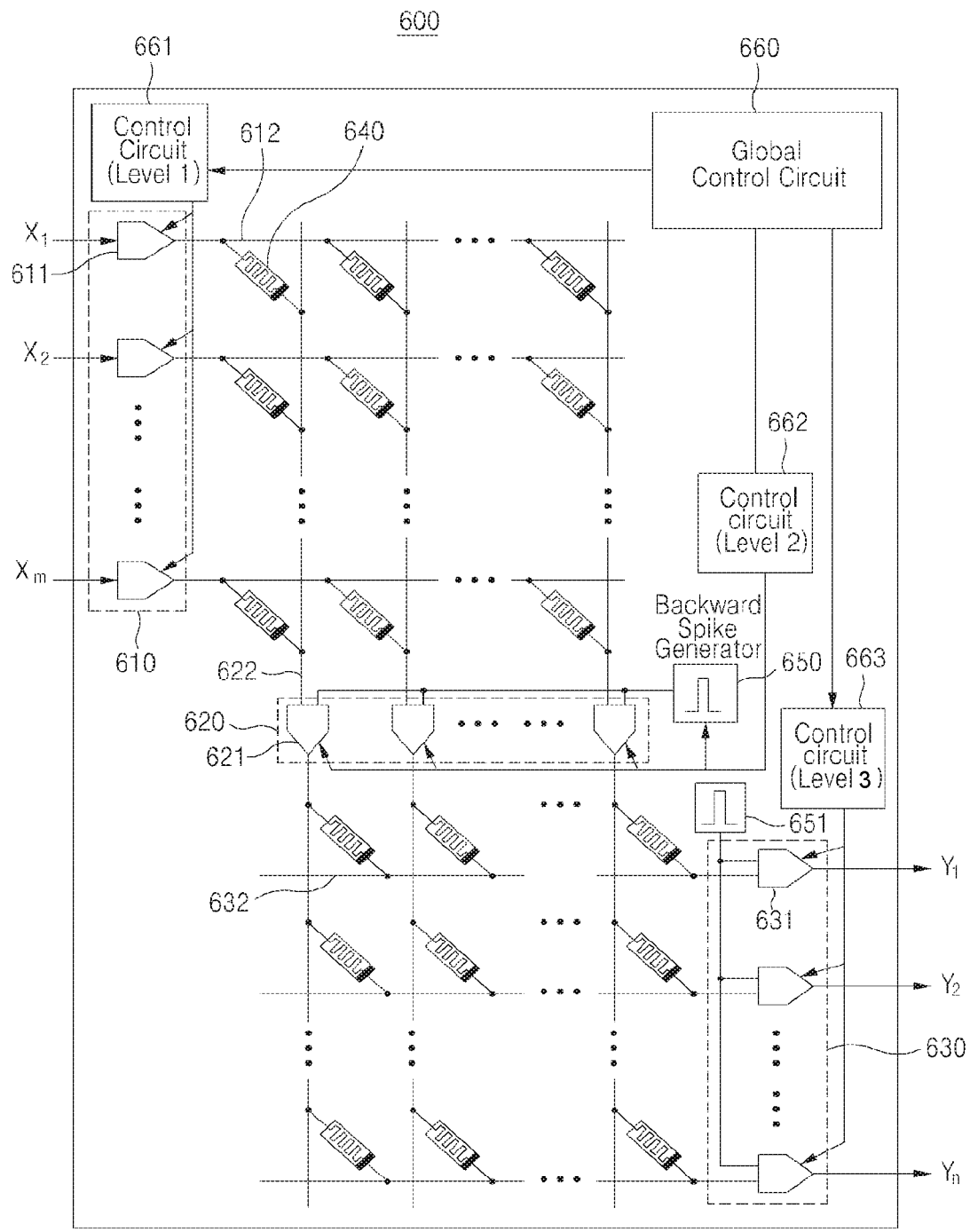

FIGS. 6 and 7 are diagrams for describing a three-layer neural network device according to an embodiment.

Referring to FIGS. 6 and 7, a three-layer neural network device 600 according to an embodiment includes a plurality of neurons 611, 621, and 631 disposed for each of an input layer 610, a hidden layer 620, and an output layer 630, a plurality of PCMs 640 connecting between an input line 612 of the input layer 610 and a connection line 622 of the hidden layer 620 and between the connection line 622 of the hidden layer 620 and an output line 632 of the output layer 630, and two BSGs 650 generating a spike based on the pulse output from each of the neurons 621 of the hidden layer 620 or the output pulse output from each of the neurons 631 of the output layer 630.

Each of the plurality of neurons 611, 621, and 631 includes different components for each layer. In particular, each of the plurality of neurons 611, 621, and 631 may exclude components for implementing unnecessary functions for each layer to be disposed and may include only the components for implementing necessary functions. That is, each of the plurality of neurons 611, 621, and 631 may include different components depending on the layer to be disposed.

For example, each of the neurons 611 of the input layer 610 among the plurality of neurons 611, 621, and 631 may include only the component for implementing functions necessary to process an input pulse. Each of the neurons 621 of the hidden layer 620 among the plurality of neurons 611, 621, and 631 may include only the component for implementing functions of transmitting a pulse transmitted from the neurons 611 of the input layer 610 to the neurons 631 of the output layer 630. Each of the neurons 631 of the output layer 630 among the plurality of neurons 611, 621, and 631 may include only the component for implementing functions necessary to process an output pulse. For a more specific example, each of the neurons 611 of the input layer 610 among the plurality of neurons 611, 621, and 631 may include a PMOS and an NMOS other than the backward pulse driver. Each of the neurons 621 of the hidden layer 620 among the plurality of neurons 611, 621, and 631 may include a PMOS and an NMOS other than the Winner-Takes-All (WTA) driver. Each of the neurons 631 of the output layer 630 among the plurality of neurons 611, 621, and 631 may include a PMOS and an NMOS other than the forward pulse driver.

As such, each of the plurality of neurons 611, 621, and 631 may include the components minimized to implement only the functions according to layers to be disposed, thereby reducing the circuit area and energy consumption as compared to the conventional neuron.

Moreover, while including only the components for implementing functions necessary to process an input pulses, the neurons 611 of the input layer 610 among the plurality of neurons 611, 621, and 631 may include the components for generating regular rectangular pulses instead of generating irregular pulses. As such, the energy calculation of an event occurring in the neurons 611 of the input layer 610 may be simplified.

Each of the plurality of PCMs 640 is crystallized in response to a crystallization current, thereby implementing a multivalued bit. Because each of the plurality of PCMs 640 is the same as a plurality of capacitive devices (PCMs) used in the conventional neural network device, the detailed description thereof will be omitted.

In generating a spike based on the pulse output from each of the neurons 621 of the hidden layer 620, the first BSG 650 disposed to be connected to each of the neurons 621 of the hidden layer 620 among the two BSGs 650 and 651 is shared by the neurons 621 of the hidden layer 620. That is, the first BSG 650 may be disposed at the output terminal of the hidden layer 620 to be connected to each of the neurons 621 of the hidden layer 620 and may be shared by the neurons 621 of the hidden layer 620. When the hidden layer 620 is composed of a plurality of layers, the first BSG 650 may be disposed at one output terminal adjacent to the output layer among a plurality of hidden layers. However, an embodiment is not limited or restricted thereto. For example, the plurality of first BSGs 650 may be implemented to be disposed in each of the plurality of hidden layers.

In generating a spike based on the pulse output from each of the neurons 631 of the output layer 630, the second BSG 651 disposed to be connected to each of the neurons 631 of the output layer 630 among the two BSGs 650 and 651 is shared by the neurons 631 of the output layer 630. In other words, the second BSG 651 may be disposed at the output terminal of the neural network device 600 to be connected to each of the neurons 631 of the output layer 630 and may be shared by the neurons 631 of the output layer 630.

As described above, each of the plurality of neurons 611, 621, and 631 may have the reduced circuit area compared to the conventional neuron (each of the conventional neuron includes unnecessary components not related to the disposed layer and includes an SG), thereby minimizing the total circuit area of the neural network device 600.

In addition, as a plurality of neurons 611, 621, and 631 share the two BSGs 650 and 651, the neural network device 600 may be variously used through only changing the BSG 651 connected to each of the neurons 631 of the output layer 630 among the two BSGs 650 and 651. The detailed description thereof is described above with reference to FIGS. 3 and 4, and thus it will be omitted.

In addition, the neural network device 600 may include at least one control circuit 660, 661, 662, or 663 that synchronizes the timing of each of the pulses output from all of the plurality of neurons 611, 621, and 631. Here, the at least one control circuit 661, 662, and 663 may be provided for each layer.

For example, the level-1 control circuit 661 may be provided to synchronize the timing of the pulse output from each of the neurons 611 of the input layer 610; the level-2 control circuit 662 may be provided to synchronize the timing of the output pulse output from each of the neurons 621 of the hidden layer 620; the level-3 control circuit 663 may be provided to synchronize the timing of the output pulse output from each of the neurons 631 of the output layer 630. In addition, the global control circuit 660 for controlling the level-1 control circuit 661, the level-2 control circuit 662, and the level-3 control circuit 663 may be further provided. Accordingly, the neural network device 600 includes the at least one control circuit 600, 661, 662, or 663, thereby allowing the plurality of neurons 611, 621, and 631 to output pulses at the same timing and to operate synchronously. The detailed description thereof is described above with reference to FIGS. 5A and 5B, and thus it will be omitted.

As described above, an embodiment is exemplified as the hidden layer 620 is composed of a single layer, but it is not limited or restricted thereto. For example, the hidden layer 620 may be composed of a plurality of layers. In this case, it may also be described with the above-described structure.

Figure 8:
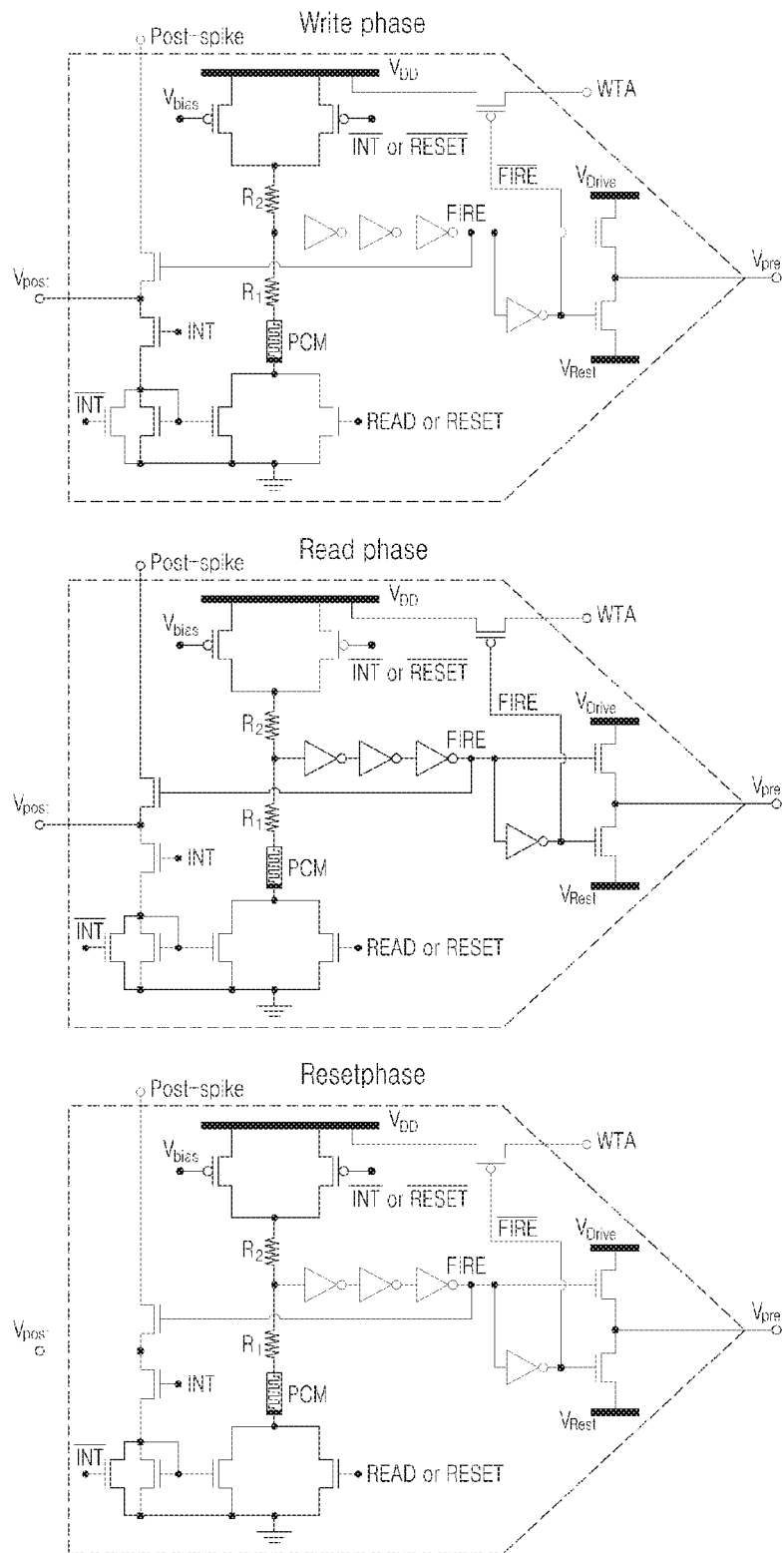
FIGS. 8 to 10 are diagrams for describing a cell operation of a neuron in a neural network device according to an embodiment.
Figure 9:
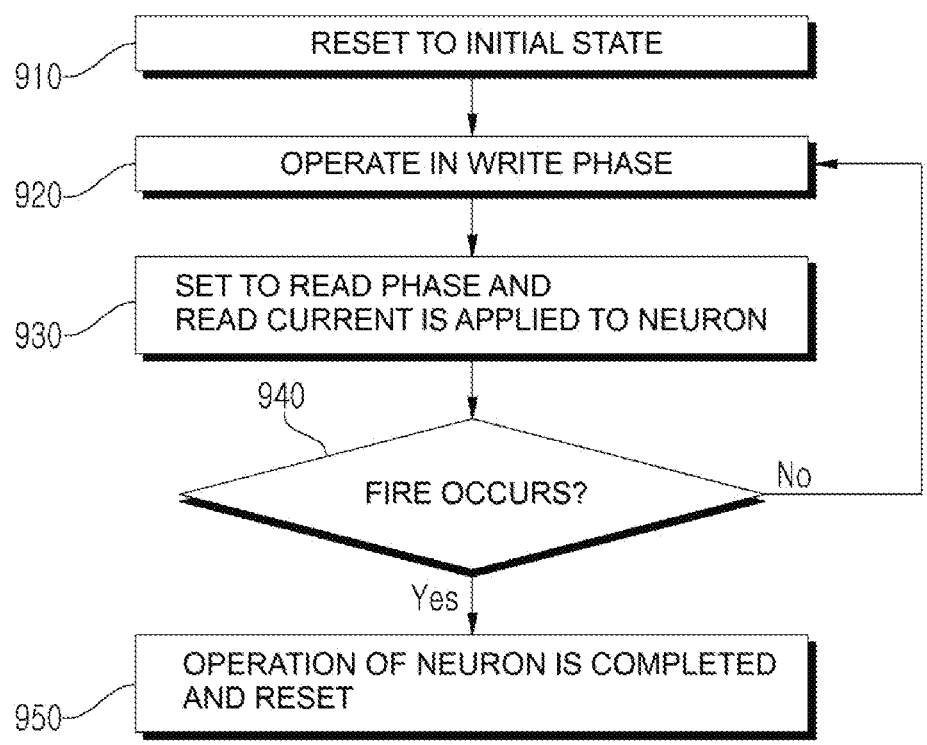
Figure 10:
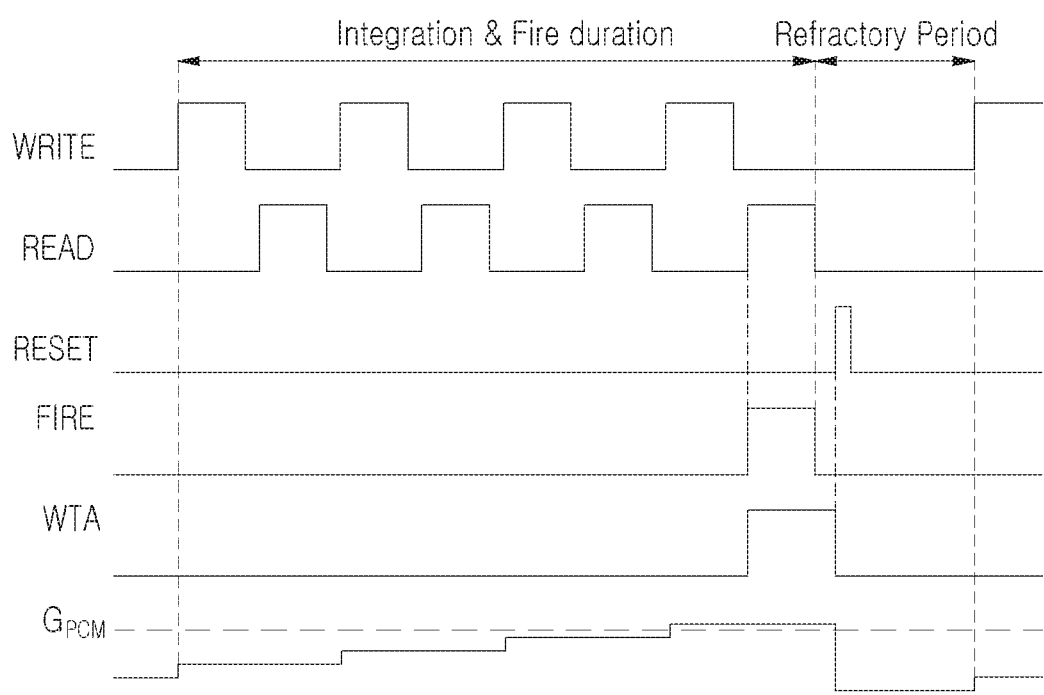

FIGS. 8 to 10 are diagrams for describing a cell operation of a neuron in a neural network device according to an embodiment. In more detail, FIG. 8 is a diagram illustrating a component activated among neural components for describing an operation of a neuron; FIG. 9 is a flowchart for describing an operation of a neuron; FIG. 10 is a diagram illustrating a timing diagram according to an operation of a neuron.

Referring to FIG. 8, each of a plurality of neurons included in a neural network device described above with reference to FIGS. 1 and 2 operates in three phases such as a write phase, a read phase, and a reset phase. Hereinafter, the operation of each of the plurality of neurons is the same as one another, and thus the corresponding operation will be described with respect to any one of the neurons in an output layer. However, an embodiment is not limited or restricted thereto, and a neuron included in an input layer or a hidden layer may also operate identically.

For example, in the write phase, the input current integrated by a crossbar is copied to crystallize the PCM to form a crystallization current such that the conductance of the PCM (a PCM corresponding to a neuron among a plurality of PCMs) increases and is applied to the PCM. As such, only the component thickly displayed on the drawing among the components included in the neuron may be activated; the component blurredly displayed on the drawing may be deactivated.

For another example, in the read phase, it is detected whether the conductance of the PCM reaches a threshold. Accordingly, only the component thickly displayed on the drawing among the components included in the neuron may be activated; the component blurredly displayed on the drawing may be deactivated.

For still another example, in the reset phase, the conductance of the PCM is reset to a completely low state. As such, only the component thickly displayed on the drawing among the components included in the neuron may be activated; the component blurredly displayed on the drawing may be deactivated.

'Integrate and Fire' operation (a spike is generated, and then the spike is provided from a neuron to synapses) of a neuron are performed in order the same as the illustration of FIG. 9. In operation 910, a neuron is completely reset to an initial state.

Next, in operation 920, as the spatial summation of the synaptic weighted current is applied, the neuron operates in the write phase.

Next, in operation 930, a neuron may be set to the read phase, and then the read current may be applied to the neuron in the read phase; 'Fire' that allows a pulse to be applied to a synapse may occur, or 'No fire' that protects synapses from the pulse may occur.

Afterward, it is determined whether 'Fire' has occurred in a neuron (e.g., whether 'Fire' occurs is detected and controlled by an external circuit) in operation 940; when 'Fire' occurs, in operation 950, the operation of a neuron is completed and then the neuron is reset during a refractory period. At this time, in operation 940, it may be determined whether 'Fire' has occurred, depending on whether the conductivity of the neuron has reached a threshold value.

When the conductivity of the neuron reaches a threshold value, it is determined that 'Fire' has occurred in the neuron and operation 950 may be performed. On the other hand, when it is determined in operation 940 that 'Fire' has not occurred (when the conductivity of the neuron has not reached the threshold), the neuron may operate again from operation 920.

The timing diagram of the neuron operating in this manner is represented as illustrated in FIG. 10.

Figure 11:
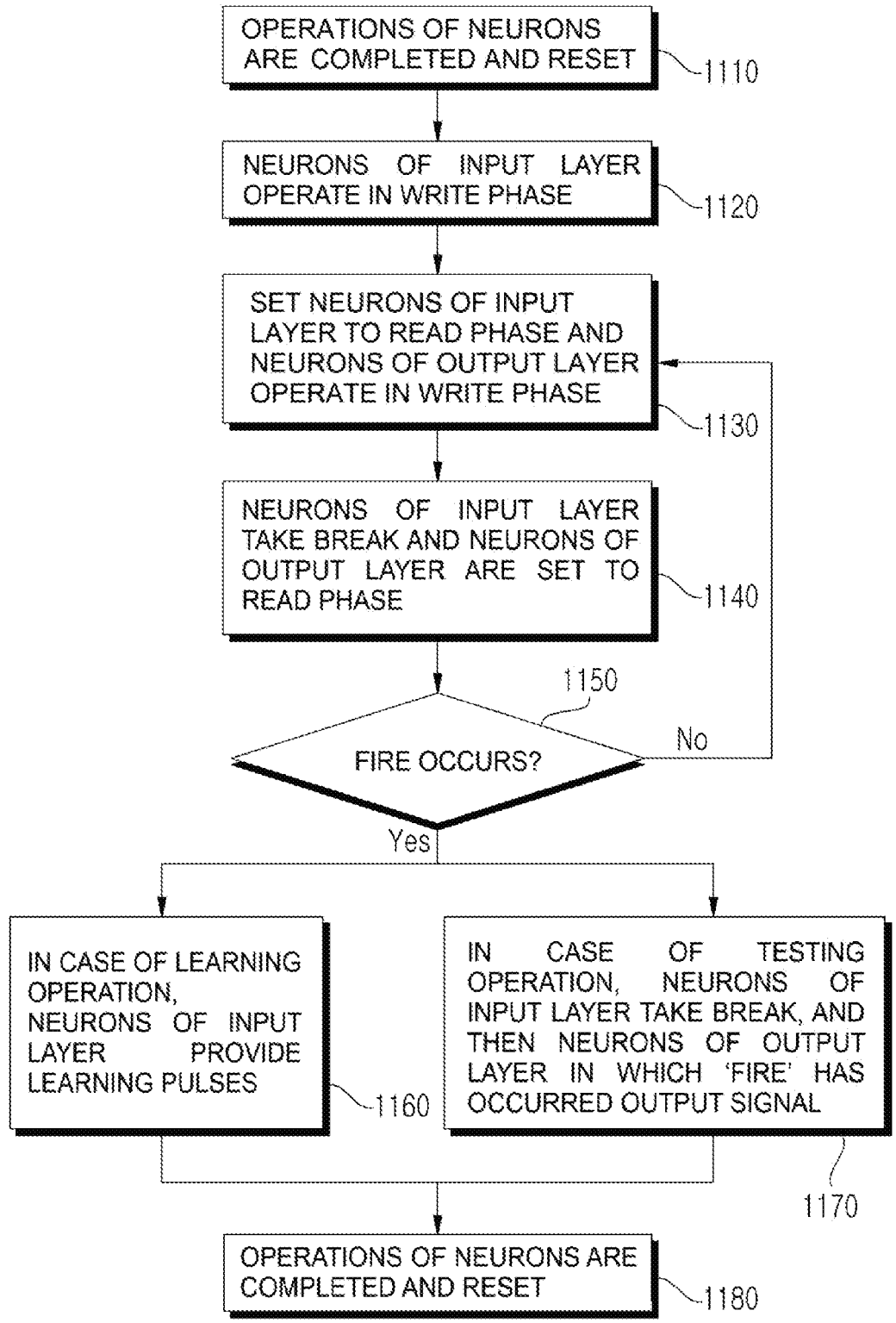
FIGS. 11 and 12 are diagrams for describing an operation of a 2-layer neural network device according to an embodiment.
Figure 12:
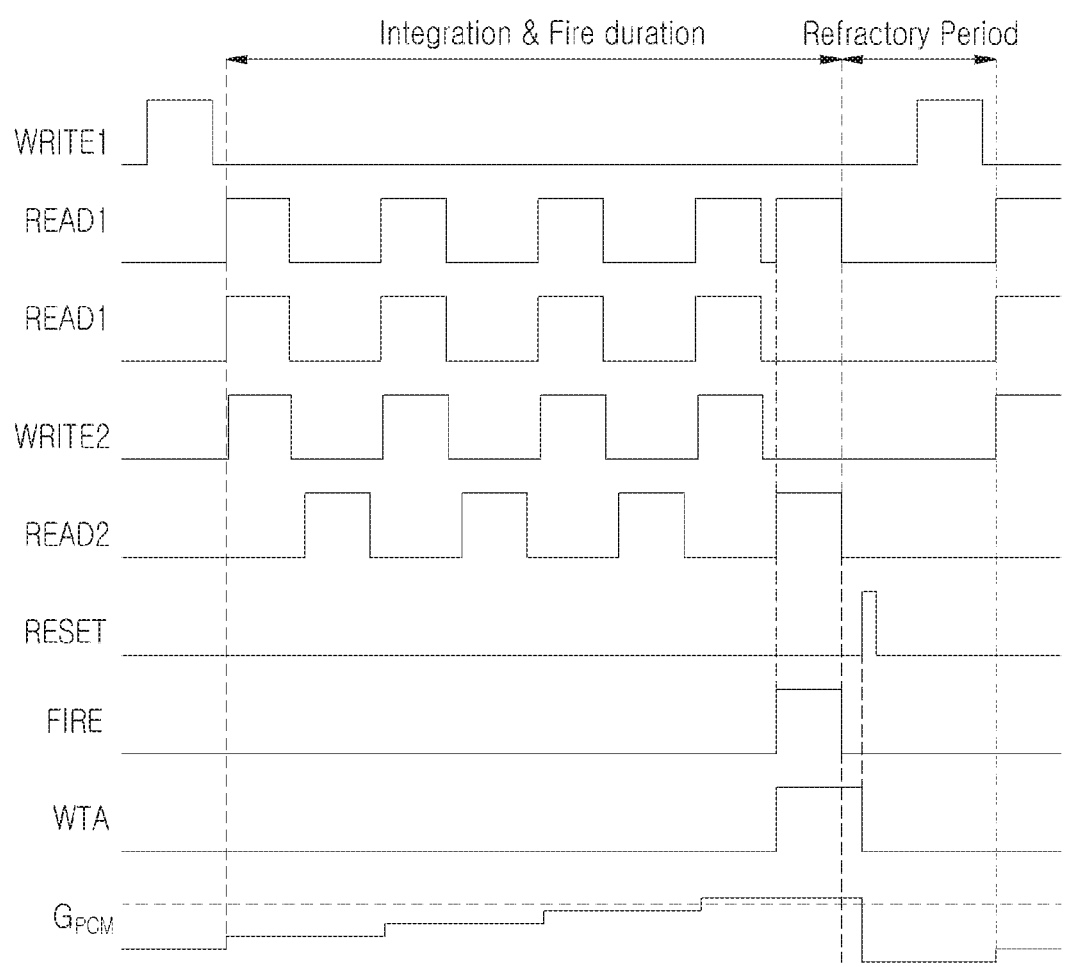

FIGS. 11 and 12 are diagrams for describing an operation of a 2-layer neural network device according to an embodiment. In particular, FIG. 11 is a flow chart for describing an operation of a 2-layer neural network device; FIG. 12 is a diagram illustrating a timing diagram according to an operation of a 2-layer neural network device.

Referring to FIG. 11, in operation 1110, a plurality of neurons included in a neural network device are completely reset to an initial state.

Next, in operation 1120, as pattern pulses are provided as current or not, neurons of an input layer among the plurality of neurons operate in a write phase.

Next, in operation 1130, as neurons of the input layer among the plurality of neurons are set to a read phase, neurons of the output layer among the plurality of neurons operate in the write phase (at this time, a pattern pulse may be replaced with the next pattern pulse).

Next, in operation 1140, neurons of the input layer among the plurality of neurons take a break, and then neurons of the output layer among the plurality of neurons are set to the read phase.

Next, in operation 1160 and operation 1170, when 'Fire' occurs, a learning operation or a testing operation may be performed, by determining whether 'Fire' has occurred in neurons (in operation 1150) (e.g., it is detected and controlled by an external circuit whether 'Fire' occurs).

In operation 1160, in the case of the learning operation, neurons of the input layer among the plurality of neurons provide learning pulses. For example, in operation 1160, the operation of a general BSG may be started.

In operation 1170, in the case of the testing operation, neurons of the input layer among the plurality of neurons take a break, and then neurons of the output layer in which 'Fire' has occurred output a signal.

Afterward, in operation 1180, the operations of neurons are completed and reset during the refractory period.

When it is determined in operation 1150 that 'Fire' has not occurred, the neural network device may operate again from operation 1130.

The timing diagram of the neuron operating in this manner is represented as illustrated in FIG. 12. In FIG. 12, WRITE 1 and READ 1 refer to enable signals for neurons in the input layer; WRITE 2 and READ 2 refer to enable signals for neurons in the output layer. Accordingly, in the testing operation, READ1 may be independently activated as FIRE signal to complete synaptic weight update.

While embodiments have been shown and described with reference to the accompanying drawings, it will be apparent to those skilled in the art that various modifications and variations can be made from the foregoing descriptions. For example, adequate effects may be achieved even if the foregoing processes and methods are carried out in different order than described above, and/or the aforementioned elements, such as systems, structures, devices, or circuits, are combined or coupled in different forms and modes than as described above or be substituted or switched with other components or equivalents.

Therefore, other implements, other embodiments, and equivalents to claims are within the scope of the following claims.

The invention claimed is:

1. A phase change material (PCM)-based neural network device comprising:
   a plurality of neurons disposed on each of an input layer and an output layer;
   a plurality of PCMs connecting between input lines of the input layer and output lines of the output layer; and
   at least one backward spike generator (BSG) shared by the plurality of neurons disposed on the output layer, and the at least one BSG is configured to generate a spike based on an output pulse output from each of the neurons of the output layer.

2. The PCM-based neural network device of claim 1, wherein each of the plurality of neurons included in the input layer includes different components from the plurality of neurons included in the output layer.

3. The PCM-based neural network device of claim 2, wherein each of the neurons of the input layer includes a PMOS and an NMOS other than a backward pulse driver, and
   wherein each of the neurons of the output layer includes a PMOS and an NMOS other than a forward pulse driver.

4. The PCM-based neural network device of claim 1, further comprising:
   at least one control circuit configured to synchronize timing of a pulse output from each of the plurality of neurons and synchronize timing of the shared backward spike generator.

5. The PCM-based neural network device of claim 4, wherein the at least one control circuit is provided for each of the input and output layers.

6. The PCM-based neural network device of claim 5, wherein the at least one control circuit includes:
   a level-1 control circuit configured to synchronize timing of a pulse output from each of the neurons of the input layer;
   a level-2 control circuit configured to synchronize timing of an output pulse output from each of the neurons of the output layer; and
   a global control circuit configured to control the level-1 control circuit and the level-2 control circuit.

7. A phase change material (PCM)-based neural network device comprising:
   a plurality of neurons disposed on each of an input layer, a hidden layer, and an output layer;
   a plurality of PCMs connecting between input lines of the input layer and connection lines of the hidden layer and between connection lines of the hidden layer and output lines of the output layer; and
   at least one backward spike generator (BSG) shared by at least one of the plurality of neurons disposed on the hidden layer or the plurality of neurons disposed on the output layer, and the at least BSG is configured to generate a spike based on a corresponding one of a pulse output from of the neurons of the hidden layer or an output pulse output from each of the neurons of the output layer.

8. The PCM-based neural network device of claim 7, wherein each of the plurality of neurons includes different components compared to the plurality of neurons included in another of the input, hidden, and output layers.

9. The PCM-based neural network device of claim 8, wherein each of the neurons of the input layer includes a PMOS and an NMOS other than a backward pulse driver, and
   wherein each of the neurons of the hidden layer includes a PMOS and an NMOS other than a Winner-Takes-All (WTA) driver, and
   wherein each of the neurons of the output layer includes a PMOS and an NMOS other than a forward pulse driver.

10. The PCM-based neural network device of claim 7, further comprising:
    at least one control circuit configured to synchronize timing of a pulse output from each of the plurality of neurons and synchronize timing of the shared backward spike generator.

11. The PCM-based neural network device of claim 10, wherein the at least one control circuit is provided for each of the input, hidden, and output layers.

12. The PCM-based neural network device of claim 11, wherein the at least one control circuit includes:
    a level-1 control circuit configured to synchronize timing of a pulse output from each of the neurons of the input layer;
    a level-2 control circuit configured to synchronize timing of a pulse output from each of the neurons of the hidden layer;
    a level-3 control circuit configured to synchronize timing of an output pulse output from each of the neurons of the output layer; and
    a global control circuit configured to control the level-1 control circuit, the level-2 control circuit, and the level-3 control circuit.

* * * * *